United States Patent
Takagi et al.

(10) Patent No.: US 9,711,721 B2
(45) Date of Patent: Jul. 18, 2017

(54) NONVOLATILE MEMORY DEVICE AND METHOD OF MANUFACTURING THE SAME

(71) Applicant: Kabushiki Kaisha Toshiba, Minato-ku (JP)

(72) Inventors: Takeshi Takagi, Yokkaichi (JP); Takeshi Yamaguchi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/455,148

(22) Filed: Aug. 8, 2014

(65) Prior Publication Data

US 2015/0255512 A1  Sep. 10, 2015

Related U.S. Application Data

(60) Provisional application No. 61/949,517, filed on Mar. 7, 2014.

(51) Int. Cl.
*H01L 27/24* (2006.01)
*H01L 45/00* (2006.01)

(52) U.S. Cl.
CPC .......... *H01L 45/146* (2013.01); *H01L 27/249* (2013.01); *H01L 27/2454* (2013.01); *H01L 45/08* (2013.01); *H01L 45/145* (2013.01); *H01L 45/16* (2013.01); *H01L 45/1633* (2013.01)

(58) Field of Classification Search
CPC .................................................. H01L 27/2454
See application file for complete search history.

(56) References Cited

U.S. PATENT DOCUMENTS

| 8,258,038 | B2 | 9/2012 | Nozawa | |
| 2010/0155687 | A1 | 6/2010 | Reyes et al. | |
| 2010/0219392 | A1* | 9/2010 | Awaya et al. | 257/3 |
| 2011/0205783 | A1 | 8/2011 | Murooka | |

(Continued)

FOREIGN PATENT DOCUMENTS

| JP | 2010-9669 | 1/2010 |
| JP | 2010-153868 | 7/2010 |

(Continued)

OTHER PUBLICATIONS

Taiwanese Office Action issued Feb. 17, 2016 in Patent Application No. 104104804 (with English Translation).

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

According to one embodiment, a plurality of first wirings are disposed in a first direction and a second direction which intersect with each other, and extended in a third direction. A second wiring stack is configured to include second wirings and interlayer insulating films which are extended and alternately stacked in the second direction. A memory cell includes, in the first direction, a first variable resistive layer which is disposed on a side near the first wiring and a second variable resistive layer which is disposed on a side near the second wiring. The second variable resistive layer is disposed between the interlayer insulating films in the third direction, and made of a material which is obtained by oxidizing the second wiring.

21 Claims, 17 Drawing Sheets

(56) References Cited

U.S. PATENT DOCUMENTS

| | | | |
|---|---|---|---|
| 2012/0313066 A1 | 12/2012 | Park et al. | |
| 2012/0319072 A1 | 12/2012 | Wei et al. | |
| 2013/0075687 A1* | 3/2013 | Tanaka | H01L 45/04 257/4 |
| 2013/0248801 A1 | 9/2013 | Yamamoto | |

FOREIGN PATENT DOCUMENTS

| | | |
|---|---|---|
| JP | 2010-199348 | 9/2010 |
| JP | 2010-287872 | 12/2010 |
| JP | 2011-114202 | 6/2011 |

* cited by examiner

NONVOLATILE MEMORY DEVICE AND METHOD OF MANUFACTURING THE SAME

CROSS-REFERENCE TO RELATED APPLICATIONS

This application is based upon and claims the benefit of priority from U.S. Provisional Application No. 61/949,517, filed on Mar. 7, 2014; the entire contents of which are incorporated herein by reference.

FIELD

Embodiments described herein relate generally to a nonvolatile memory device.

BACKGROUND

Resistive random access memory (hereinafter, referred to as ReRAM) in which a variable resistive layer capable of retaining a plurality of resistance states is used in a memory element is known. ReRAM having a three-dimensional structure in which a plurality of nR-1Tr type strings in which a plurality of word lines are disposed on the side surfaces of bit lines, which are disposed perpendicular to a substrate and include select transistors at end portions thereof close to the substrate, in a height direction through variable resistive layers are disposed on the substrate has been proposed in the related art.

Since current flows in the ReRAM during a set operation and a reset operation, the word lines and the bit lines are required to have low resistance. Further, in order to stabilize the operations of the ReRAM, it is effective to employ a bilayer structure which includes a high resistance layer and a low resistance layer. However, in a case where the bilayer structure is applied to the ReRAM having the three-dimensional structure, the miniaturization of the ReRAM having the three-dimensional structure becomes difficult.

DETAILED DESCRIPTION

According to one embodiment, a nonvolatile memory device includes a plurality of first wirings, second wiring stacks, and memory cells. The plurality of first wirings are configured to be arranged in a first direction and a second direction intersecting with each other, and extended in a third direction perpendicular to the first direction and the second direction. The second wiring stacks are configured to include second wirings and interlayer insulating films which are extended and alternately stacked in the third direction. The memory cells are configured to be disposed at positions between the first wirings and the second wirings where the first wirings and the second wirings intersect. The memory cell includes, in the first direction, a first variable resistive layer which is disposed on a side near the first wiring and a second variable resistive layer which is disposed on a side near the second wiring. The second variable resistive layer is disposed between the interlayer insulating films in the third direction, and made of a material which is obtained by oxidizing the second wiring.

Hereinafter, a nonvolatile memory device and a method of manufacturing the same according to embodiments will be described in detail with reference to the accompanying drawings. In addition, the invention is not limited to these embodiments. Further, the cross-sectional views, the top views, and the perspective views of the nonvolatile memory device to be used in the following embodiments are schematically illustrated, and thus there may be differences from the practical matters in a relation between thickness and width of a layer, a ratio of thicknesses of the respective layers, and the like.

First Embodiment

Figure 1:
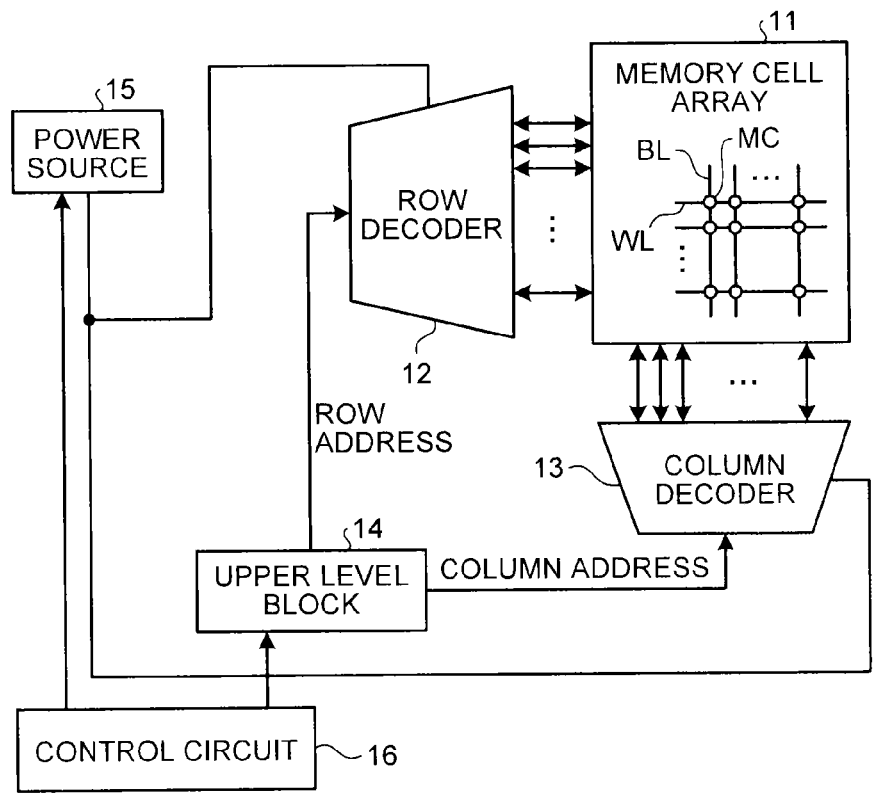
FIG. 1 is a diagram illustrating an example of main components of a nonvolatile memory device according to a first embodiment.

FIG. 1 is a diagram illustrating an example of main components of a nonvolatile memory device according to a first embodiment. The nonvolatile memory device includes a memory cell array 11, a row decoder 12, a column decoder 13, a upper level block 14, a power source 15, and a control circuit 16.

The memory cell array 11 includes a plurality of word lines WL and a plurality of bit lines BL which intersect with each other, and memory cells MC which are disposed at the intersections of the lines. The row decoder 12 selects a word line WL at the time of access (data erasing/writing/reading). The column decoder 13 includes a driver which selects the bit line BL at the time of access and controls an access operation.

The upper level block 14 selects a memory cell MC which becomes an access target in the memory cell array 11. The upper level block 14 assigns a row address and a column address to the row decoder 12 and the column decoder 13, respectively. For the operations of data erasing/writing/reading, the power source 15 generates a combination of predetermined voltages corresponding to the respective operations and supplies the voltages to the row decoder 12 and the column decoder 13. The control circuit 16 performs control such as sending an address to the upper level block 14 according to a command from the outside, and performs control of the power source 15.

Figure 2:
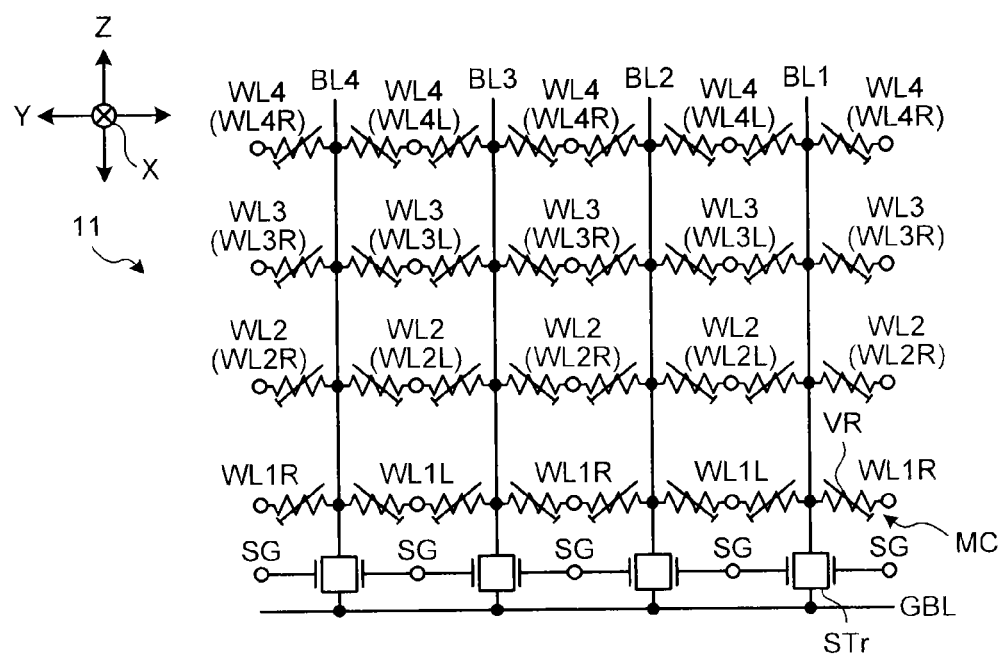
FIG. 2 is a circuit diagram illustrating an example of a memory cell array.
Figure 3:
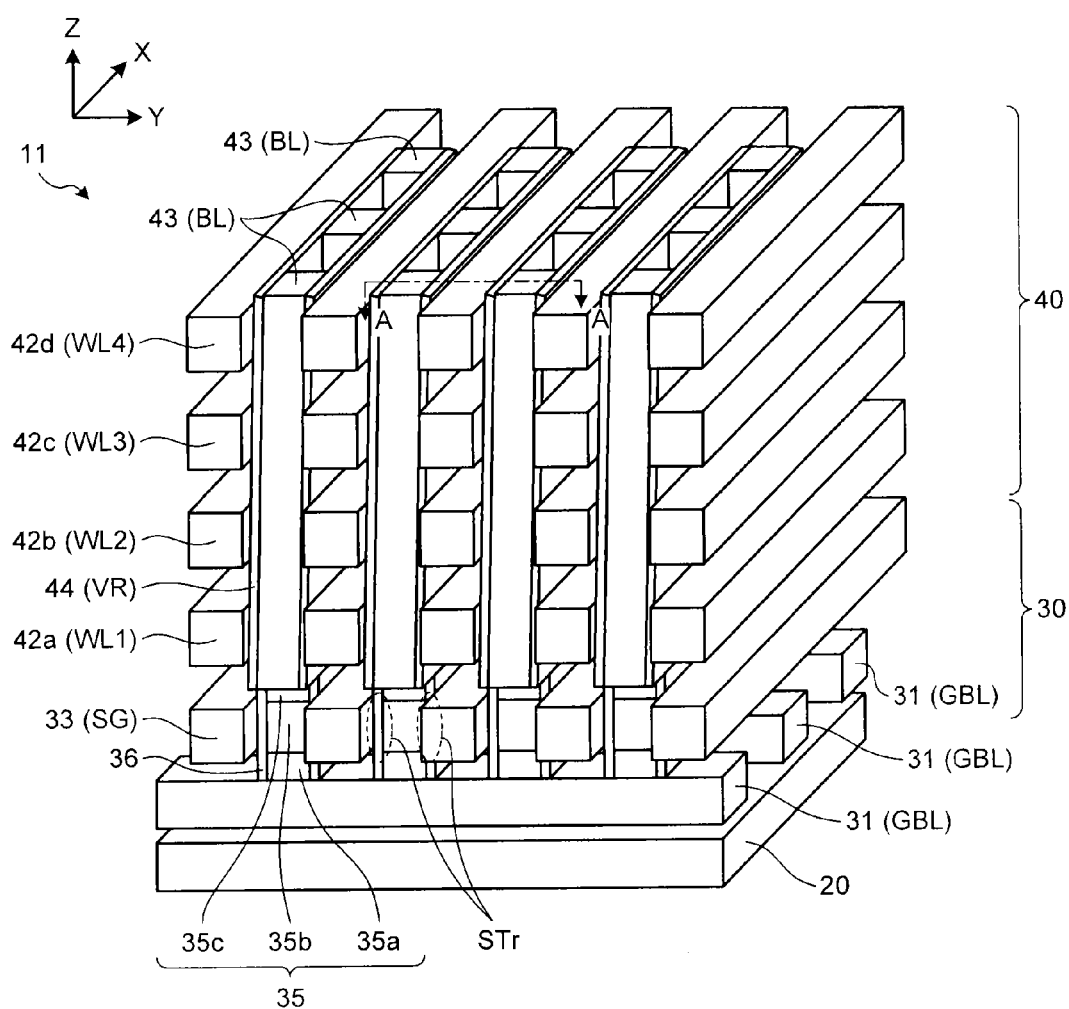
FIG. 3 is a perspective view illustrating an example of a stack structure of a memory cell array.

FIG. 2 is a circuit diagram illustrating an example of a memory cell array, and FIG. 3 is a perspective view illustrating an example of a stack structure of the memory cell array. In addition, an X direction, a Y direction, and a Z direction are orthogonal to each other in FIG. 2, and the X direction is perpendicular to the sheet. Further, the structure illustrated in FIG. 2 is repeatedly provided in the X direction.

Besides the word lines WL, the bit lines BL, and the memory cells MC described above, the memory cell array 11 includes select transistors STr, global bit lines GBL, and select gate lines SG as illustrated in FIG. 2.

As illustrated in FIGS. 2 and 3, the word lines WL1 to WL4 are arranged at a predetermined pitch in the Z direction and extended in the X direction. The bit lines BL are arranged in a matrix in the X direction and the Y direction, and extended in the Z direction. The memory cells MC are disposed at positions where the word lines WL and the bit lines BL intersect. Therefore, the memory cells MC are arranged in a three-dimensional matrix in the X, Y, and Z directions. As illustrated in FIG. 2, the memory cells MC include variable resistive elements VR.

As illustrated in FIG. 2, the select transistors STr are provided between one ends of the bit lines BL and the global bit lines GBL. The global bit lines GBL are arranged at a predetermined pitch in the X direction, and extended in the Y direction. One global bit line GBL is connected in common to one ends of the plurality of select transistors STr which are arranged in a line in the Y direction.

Further, gate electrodes of adjacent two select transistors STr arranged in the Y direction can be connected in common to each other. The select gate lines SG are arranged at a predetermined pitch in the Y direction, and extended in the X direction. One select gate line SG is connected in common to the gate electrodes of the plurality of select transistors STr arranged in a line in the X direction. In addition, the two select transistors STr can be operated independently by dividing the gate electrodes of the adjacent two select transistors Sir arranged in the Y direction.

Figure 4:
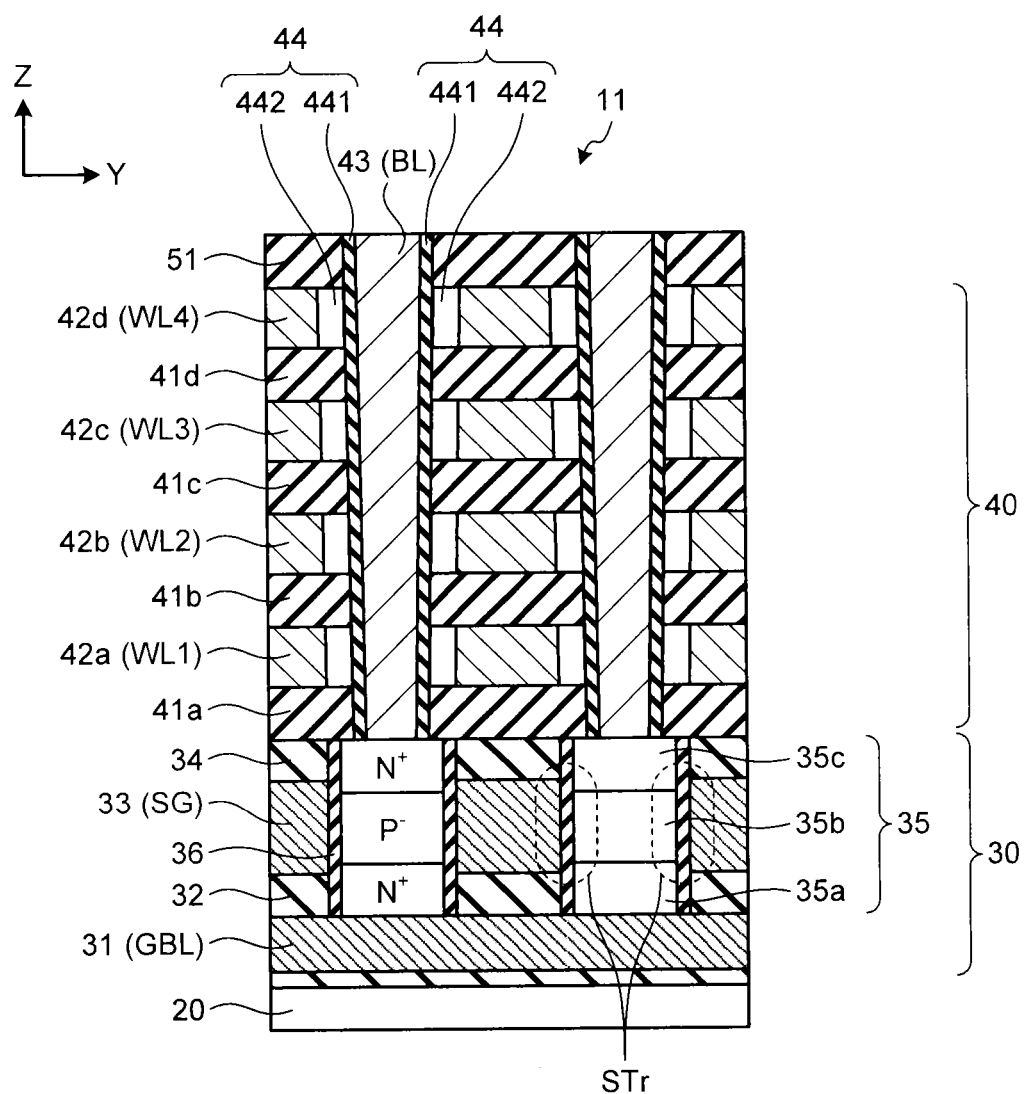
FIG. 4 is an example of a cross-sectional view taken along line A-A of FIG. 3.
Figure 5:
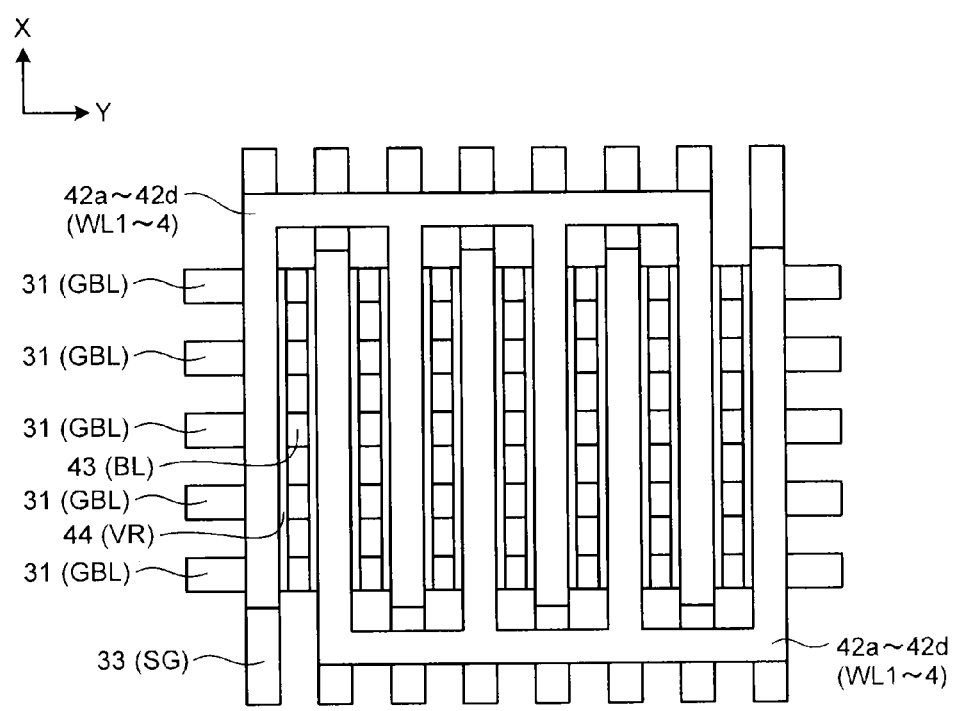
FIG. 5 is an example of a top view of FIG. 3.

Next, a stack structure of the memory cell array 11 according to the first embodiment will be described. FIG. 4 is an example of a cross-sectional view taken along line A-A of FIG. 3, and FIG. 5 is an example of a top view of FIG. 3. In addition, interlayer insulating films are not illustrated in FIGS. 3 and 5.

As illustrated in FIGS. 3 and 4, the memory cell array 11 includes a select transistor layer 30 and a memory layer 40 which are stacked on a substrate 20. The select transistor layer 30 functions as the select transistor STr, and the memory layer 40 functions as the memory cell MC.

As illustrated in FIGS. 3 and 4, the select transistor layer 30 includes conductive layers 31, interlayer insulating films 32, conductive layers 33, and interlayer insulating films 34. The conductive layers 31, the interlayer insulating films 32, the conductive layers 33, and the interlayer insulating films 34 are stacked in the Z direction perpendicular to the substrate 20. The conductive layers 31 function as the global bit lines G3L, and the conductive layers 33 function as the select gate lines SG and the gates of the select transistors STr.

The conductive layers 31 are formed in a stripe shape in which the layers are arranged at a predetermined pitch in the X direction parallel to the substrate 20, and extended in the Y direction (see FIG. 5). While not illustrated in FIG. 3, the interlayer insulating film is formed between each pair of the plurality of conductive layers 31.

The interlayer insulating films 32 are formed to cover the top surfaces of the conductive layers 31, and have a role to electrically insulate the conductive layers 31 from the select gate lines SG (the conductive layers 33). The conductive layers 33 are formed in a stripe shape in which the layers are arranged at a predetermined pitch in the Y direction, and extended in the X direction (see FIG. 5). The interlayer insulating films 34 are deposited to cover the side surfaces and the top surfaces of the conductive layers 33. For example, the conductive layers 31 and 33 are made of polysilicon. The interlayer insulating films 32 and 34 are made of silicon oxide ($SiO_2$).

Further, as illustrated in FIGS. 3 and 4, the select transistor layers 30, for example, include cylindrical semiconductor layers 35 and gate insulating layers 36. The semiconductor layers 35 function as bodies (channels) of the select transistors STr, and the gate insulating layers 36 function as gate insulating films of the select transistors STr. In addition, in the first embodiment, the select transistor layer 30 is configured by an N-channel field effect transistor.

The semiconductor layers 35 are disposed in a matrix in the X and Y directions, and extended in the Z direction. Further, the semiconductor layers 35 abut on the top surfaces of the conductive layers 31, and abut on the side surfaces of the conductive layers 33 in the Y direction through the gate insulating layers 36. Then, the semiconductor layer 35 includes an N+ semiconductor layer 35a, a P− semiconductor layer 35b, and an N+ semiconductor layer 35c which are stacked in this order from bottom to top in the Z direction.

As illustrated in FIGS. 3 and 4, the side surfaces of the N+ semiconductor layers 35a in the Y direction abut on the interlayer insulating films 32 through the gate insulating layers 36. The side surfaces of the P− semiconductor layers 35b in the Y direction abut on the side surfaces of the conductive layers 33 through the gate insulating layers 36. The side surfaces of the N+ semiconductor layers 35c in the Y direction abut on the interlayer insulating films 34 through the gate insulating layers 36. The N+ semiconductor layers 35a and 35c are made of polysilicon implanted with N+ impurities, and the P− semiconductor layer 35b is made of polysilicon implanted with P− impurities. For example, the gate insulating layer 36 is made of silicon oxide ($SiO_2$). In addition, a barrier metal layer may be formed between the semiconductor layer 35 and a conductive layer 43 to be described below and between the semiconductor layer 35 and the conductive layer 31 (not illustrated in FIG. 4).

As illustrated in FIGS. 3 and 4, the memory layer 40 includes interlayer insulating films 41a to 41d and 51, and conductive layers 42a to 42d which are alternately stacked in the Z direction. The conductive layers 42a to 42d function as the word lines WL1 to WL4, respectively. When viewed from the Z direction, the conductive layers 42a to 42d are formed in a pair of comb teeth shapes which face each other in the X direction (see FIG. 5). In other words, word lines WLiR (i=1 to 4) belonging to one of the pair of comb teeth shape of conductive layers, and word lines WLiL belonging to the other are alternately formed in the Y direction (see FIG. 2). By employing the comb teeth shape of conductive layers, it is possible to reduce the number of contacts with the word lines WL. In addition, for example, the interlayer insulating films 41a to 41d and 51 are made of silicon oxide (SiO$_2$), and the conductive layers 42a to 42d are made of a metal such as W, Ni, Ti, and Ta, and metal nitride having conductivity such as WN, TiN, and TaN.

Further, as illustrated in FIGS. 3 and 4, the memory layer 40 includes variable resistive element forming layers 44 between the conductive layers 42a to 42d (the word lines WL) and the conductive layer 43 (the bit line BL). The variable resistive element forming layer 44 includes a high resistance of first variable resistive layer 441 having a large resistivity and a low-resistance second variable resistive layer 442 having a small resistivity. The first variable resistive layers 441 are provided on the side surfaces of the plurality of cylindrical conductive layers 43 arranged in the X direction, and are shared with, for example, the side surfaces of the cylindrical conductive layers 43 in the Y direction. The second variable resistive layer 442 is disposed between each of the conductive layers 42a to 42d and the first variable resistive layer 441. Further, the second variable resistive layer 442 is disposed to be interposed between each pair of the interlayer insulating films 41a to 41d adjacent in the Z direction. In other words, the area of the second variable resistive layer 442 in the ZX plane is substantially equal to that of the conductive layers 42a to 42d (the word lines WL) in the ZX plane.

The first variable resistive layer 441 is configured by an insulating film. Examples of the first variable resistive layer 441 include a metal oxide such as a silicon oxide, an aluminum oxide, and HfO$_2$, a metal nitride such as a silicon nitride and an aluminum nitride, and the like. Further, the first variable resistive layer 441 may be formed by a stacked film of two or more layers selected from a group consisting of the above materials such as a stack structure of SiO$_x$ and HfO$_x$. The first variable resistive layer 441 has a large resistivity, so that an oxygen deficiency becomes small. In addition, it is desirable that the film thickness of the first variable resistive layer 441 be 3 nm or less. By making the film thickness of the first variable resistive layer 441 equal to or less than 3 nm, it is possible to reduce a distance between the conductive layers 42a to 42d serving as the word lines WL and the local bit lines (the conductive layers 43). As a result, a possibility that a filament is formed even in the adjacent word line WL can be reduced, and thus the filament can be reliably formed in each word line WL.

The second variable resistive layer 442 has a low resistivity compared to that of the first variable resistive layer 441, and is made of metal oxide. Examples of the second variable resistive layer 442 include WO$_x$, NiO$_x$, TiO$_x$, TaO$_x$, WON, TiON, TaON, and the like. These materials are desirably to be oxygen-deficient materials in which the composition of oxygen becomes low compared to a stoichiometric composition. Further, since the second variable resistive layer 442 has a small resistivity compared to that of the first variable resistive layer 441, the oxygen deficiency becomes large compared to that of the first variable resistive layer 441. Further, these materials are obtained by oxidizing the conductive layers 42a to 42d. In other words, in a case where the conductive layers 42a to 42d are made of W, the second variable resistive layer 442 is WO$_x$; in a case where the conductive layers 42a to 42d are made of Ni, the second variable resistive layer 442 is NiO$_x$; in a case where the conductive layers 42a to 42d are made of Ti, the second variable resistive layer 442 is TiO$_x$; in a case where the conductive layers 42a to 42d are made of Ta, the second variable resistive layer 442 is TaO$_x$; in a case where the conductive layers 42a to 42d are made of WN, the second variable resistive layer 442 is WON; in a case where the conductive layers 42a to 42d are made of TiN, the second variable resistive layer 442 is TiON; and in a case where the conductive layers 42a to 42d are made of TaN, the second variable resistive layer 442 is TaON. In addition, the second variable resistive layer 442 is configured to have a film thickness thicker than that of the first variable resistive layer 441.

Further, the band gap of the second variable resistive layer 442 is desirable to be smaller than that the first variable resistive layer 441. This is because when a voltage positive with respect to the bit lane (the conductive layer 43) is applied to, the voltage is caused to be applied to the first variable resistive layer 441, thereby easily forming a filament in the word line WL (the conductive layers 42a to 42d).

The variable resistive element forming layer 44 functions as a variable resistive element VR in a region interposed between the conductive layer 43 and the conductive layers 42a to 42d. When being applied with a positive voltage higher than a first threshold voltage, the variable resistive element forming layer 44 transitions to a low resistance state. In this state, when being applied with a negative voltage smaller than a second threshold voltage, the variable resistive element layer transitions to a high resistance state. Then, in a case where a voltage between the first threshold voltage and the second threshold voltage is applied, the low resistance state or the high resistance state is maintained with no change in resistance value. In this way, the variable resistive element forming layer 44 is configured by a material which operates in a so-called bipolar mode. In addition, in the first embodiment, the filament is generated by performing a forming process between each of the conductive layers 42a to 42d serving as the word lines WL and the conductive layer 43 serving as the local bit line. Further, a switch region is formed which performs a variable resistive operation on the vicinity (the first variable resistive layer 441) of a boundary surface of the filament on a side near the local bit line (the conductive layer 43).

The conductive layers 43 are disposed in a matrix in the X and Y directions, and have their lower ends abut on the top surface of the semiconductor layer 35 while being extended in a cylindrical shape in the Z direction. While not illustrated in FIG. 3, the interlayer insulating film is formed between the conductive layers 43 arranged in the X direction.

In the embodiment, the second variable resistive layer 442 is made of a material obtained by oxidizing the conductive layers 42a to 42d, and the first variable resistive layer 441 is provided between the side surface of the stack of the interlayer insulating films 41a to 41d and the conductive layers 42a to 42d in the Y direction and the side surface of the conductive layer 43 in the Y direction. In other words, there is no need to separately dispose the second variable resistive layer 442 in a region between the stack of the interlayer insulating films 41a to 41d and the conductive layers 42a to 42d and the conductive layer 43. Therefore, the variable resistive element forming layer 44 having a bilayer structure can be disposed in a limited space.

Figure 6A:
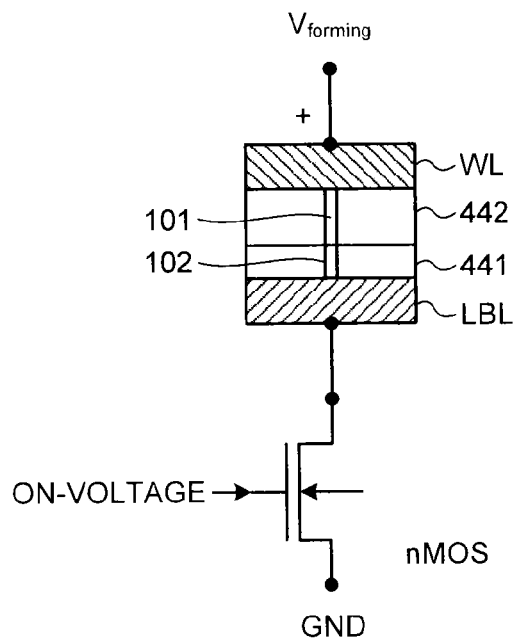
FIGS. 6A to 6C are diagrams for describing the outline of operations of the nonvolatile memory device according to the first embodiment.
Figure 6B:
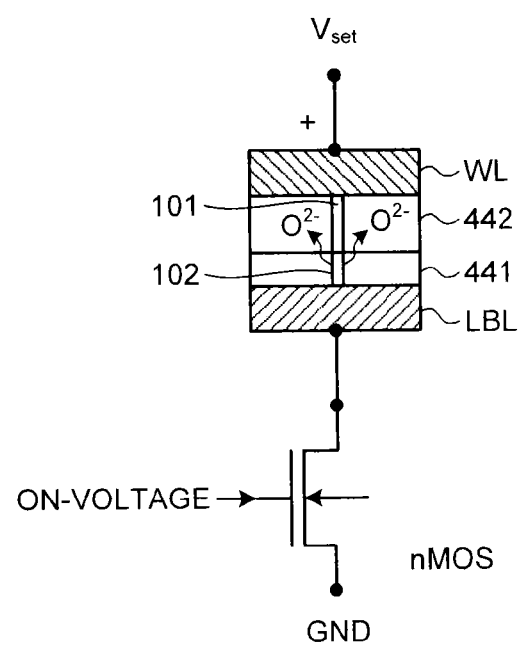
Figure 6C:
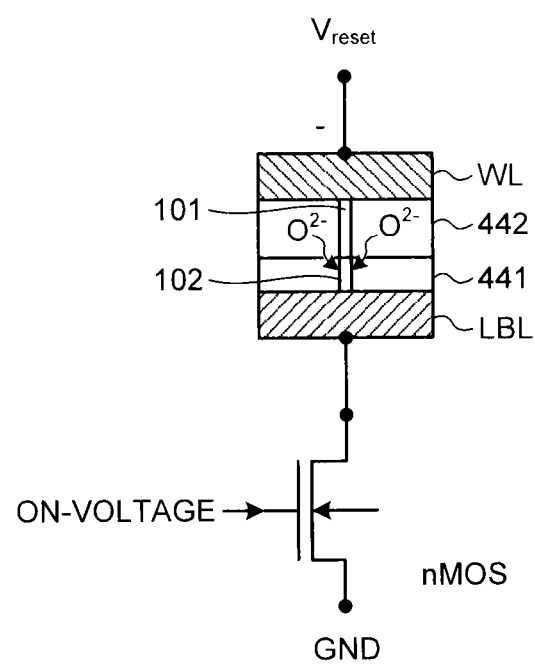

Next, a forming operation, a set operation, a reset operation, a read operation of the nonvolatile memory device having such a structure will be simply described. FIGS. 6A to 6C are diagrams for describing the outline of operations of the nonvolatile memory device according to the first embodiment.

The variable resistive element forming layer 44 constructing the memory cell MC of the nonvolatile memory device immediately after manufacture is in an insulator state, that is, a high resistance state. Thus, the forming operation is performed to form a filament 101 in the variable resistive element forming layer 44. As illustrated in FIG. 6A, in the forming operation, the control circuit 16 sets the bit line BL connected to a selected memory cell MC as a ground potential GND for example, and applies a forming voltage Vforming positive with respect to the bit line BL to the word line WL connected to the selected memory cell MC. In addition, the control circuit 16, for example, applies a voltage of Vforming/2 to an unselected word line WL. Further, an ON-voltage is applied to the N-channel select transistor of the local bit line LBL connected to the selected memory cell MC to make the select transistor enter a nonconductive state. Thus, the filament 101 is formed in the variable resistive element forming layer 44. Further, a switch region 102 of which the resistance is mainly changed is formed in the vicinity near the local bit line LBL (the first variable resistive layer 441) of the variable resistive element forming layer 44. As a result, the variable resistive element forming layer 44 enters the low resistance state. Thereafter, the reset operation is performed to make the memory cell MC transition from the low resistance state to the high resistance state, or the set operation is performed to make the memory cell MC transition from the high resistance state to the low resistance state.

As illustrated in FIG. 6B, in a case where the set operation is performed to make a certain selected memory cell MC transition from the high resistance state to the low resistance state, the control circuit 16, for example, sets the bit line BL connected to the selected memory cell MC as the ground potential GND, and applies a set voltage Vset positive with respect to the bit line BL to the word line WL connected to the selected memory cell MC. In addition, the control circuit 16, for example, applies a voltage of Vset/2 to the unselected word line WL. Further, the control circuit 16 applies the ON-voltage to the N-channel select transistor of the local bit line LEL connected to the selected memory cell MC to make the select transistor enter the conductive state. Therefore, oxygen ions $O^{2-}$ move from the switch region 102 of the selected memory cell MC toward the word line WL, and a reductive reaction occurs in the switch region 102 of the filament 101. As a result, it is considered that the resistivity of the switch region 102 is reduced and the selected memory cell transitions to the low resistance state.

As illustrated in FIG. 6C, in a case where the reset operation is performed to make a certain selected memory cell MC transition from the low resistance state to the high resistance state, the control circuit 16, for example, sets the bit line BL connected to the selected memory cell MC as the ground potential GND, and applies a reset voltage Vreset negative with respect to the bit line BL to the word line WL connected to the selected memory cell MC. In addition, the control circuit 16 applies a voltage of Vreset/2 corresponding to the half of the reset voltage Vreset to another unselected word line WL. Further, the control circuit 16 applies the ON-voltage to the N-channel select transistor of the local bit line LBL connected to the selected memory cell MC to make the select transistor enter the conductive state. Therefore, oxygen ions $O^{2-}$ move to the switch region 102 of the selected memory cell MC, and an oxidation reaction occurs in the switch region 102 of the filament 101. As a result, it is considered that the resistivity of the switch region 102 is increased and the selected memory cell transitions to the high resistance state. Therefore, in the first embodiment, the switch region 102 is formed on a side near the bit line BL to which the reset voltage Vreset positive with respect to the word line WL is applied during the reset operation.

Further, in the read operation of reading the state of the memory cell MC, the control circuit 16 applies a read voltage Vread to a selected global bit line GBL which corresponds to the local bit line LBL connected by the memory cell MC, and for example applies 0 V to another unselected global bit line GBL. Further, the control circuit 16, for example, applies 0 V to the selected word line WL connected by the selected memory cell MC, and applies a voltage of Vread/2 corresponding to the half of the read voltage Vread to another unselected word line WL. Then, the control circuit 16 makes the select transistors STr connected by the local bit line LBL selectively enter the conductive state, and maintains the other select transistors in the nonconductive state. Therefore, the read voltage Vread is applied only to the selected memory cell MC, and the read operation is performed.

Next, a method of manufacturing the nonvolatile memory device having such a configuration will be described. FIGS. 7A to 7F are cross-sectional diagrams schematically illustrating an example of procedures of manufacturing the nonvolatile memory device according to the first embodiment. In addition, these drawings illustrate the cross section taken along line A-A of FIG. 3. Further, herein, a method of manufacturing the memory layer 40 is illustrated and the description thereof will be made.

Figure 7A:
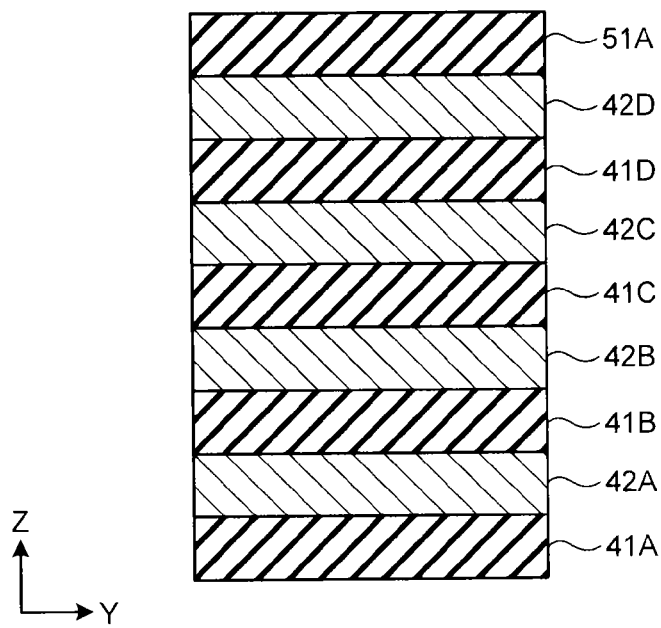
FIGS. 7A to 7F are cross-sectional diagrams schematically illustrating an example of procedures of manufacturing the nonvolatile memory device according to the first embodiment.

First, as illustrated in FIG. 7A, interlayer insulating films 41A to 41D and conductive-layer forming layers 42A to 42D are alternately stacked on the select transistor layer (not illustrated), an interlayer insulating film 51A is formed on the uppermost layer. As the interlayer insulating films 41A to 41D and 51A, for example, a $SiO_2$ film (p-TEOS (Tetraethoxysilane) film) formed by a plasma CVD (Chemical Vapor Deposition) method can be used. Further, as the conductive-layer forming layers 42A to 42D, for example, a W film formed by a PVD (Physical Vapor Deposition) method can be used.

Figure 7B:
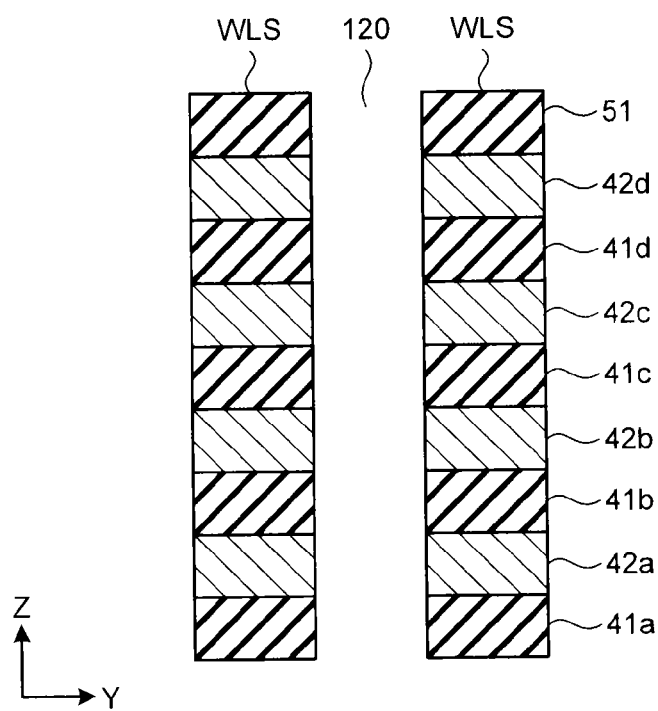

Next, as illustrated in FIG. 7B, line-shaped trenches 120 extended in the X direction are formed at a predetermined pitch in the Y direction by a lithography technique and an etching technique in the stack of the interlayer insulating films 41A to 41D and 51A and the conductive-layer forming layers 42A to 42D. With this configuration, word line stacks which are extended in the X direction and formed by alternately stacking the interlayer insulating films 41a to 41d and 51 and the conductive layers 42a to 42d are formed between the trench 120 and the trench 120. The word line stacks WLS are formed at a predetermined pitch in the Y direction. At this time, the adjacent word line stacks WLS are separated by the trench 120, so that the trench 120 is disposed at a position where the semiconductor layer 35 of the select transistor layer which is present in a not-illustrated lower layer is formed.

Figure 7C:
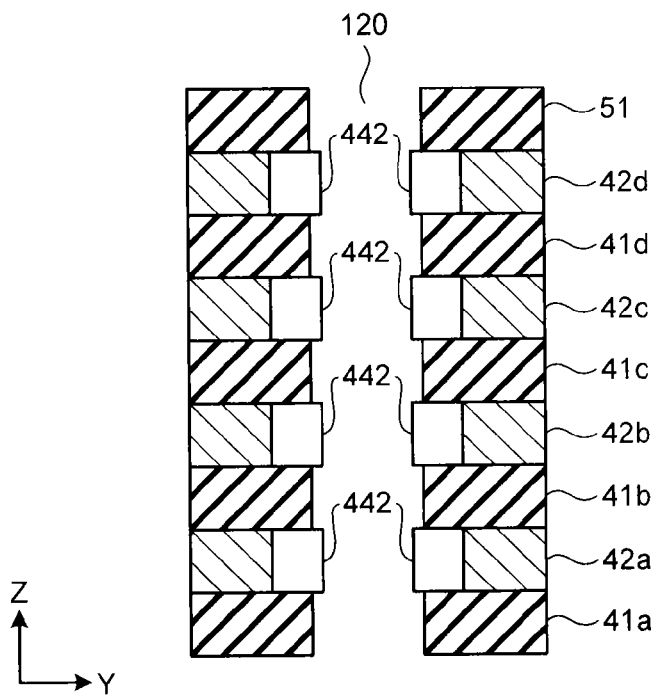

Then, as illustrated in FIG. 7C, the word lines WL (the conductive layers 42a to 42d) exposed by the trench 120 are oxidized, and the second variable resistive layers 442 having a predetermined film thickness are formed. In the oxidation process, the metal forming the conductive layers 42a to 42d is changed into metal oxide. Herein, the metal oxide is subjected to the oxidation process under a condition that the composition of oxygen becomes low compared to the stoichiometric composition. As the oxidation process, for example, oxidation using RTO (Rapid Thermal Oxidation) can be performed at a temperature of 350 to 500° C. With this process, the second variable resistive layers 442 are formed in the word lines WL (the conductive layers 42a to 42d) on a side near the trench 120. Herein, metal oxide films can be formed in a self-aligned manner only in the word lines WL (the conductive layers 42a to 42d) on a side near the trench 120. Further, since the second variable resistive layers 442 are formed by oxidizing parts of the word lines WL, the volume may be expanded and protrude in the trench 120 from the end surface of the interlayer insulating films 41a to 41d in the Y direction.

Figure 7D:
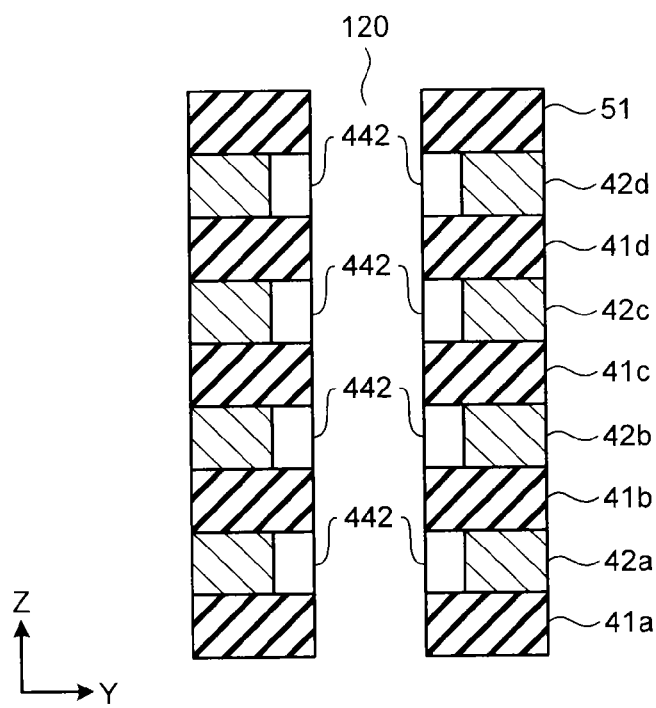

Further, as illustrated in FIG. 7D, parts of the second variable resistive layers 442 protruding from the side surfaces of the interlayer insulating films 41a to 41d and 51 in the Y direction are selectively removed from the side surface of the trench 120 by the etching technique. Therefore, in the inside of the trench 120, the side surfaces of the interlayer insulating films 41a to 41d and 51 in the Y direction become flush with the side surfaces of the second variable resistive layers 442 in the Y direction without substantially having no step.

Figure 7E:
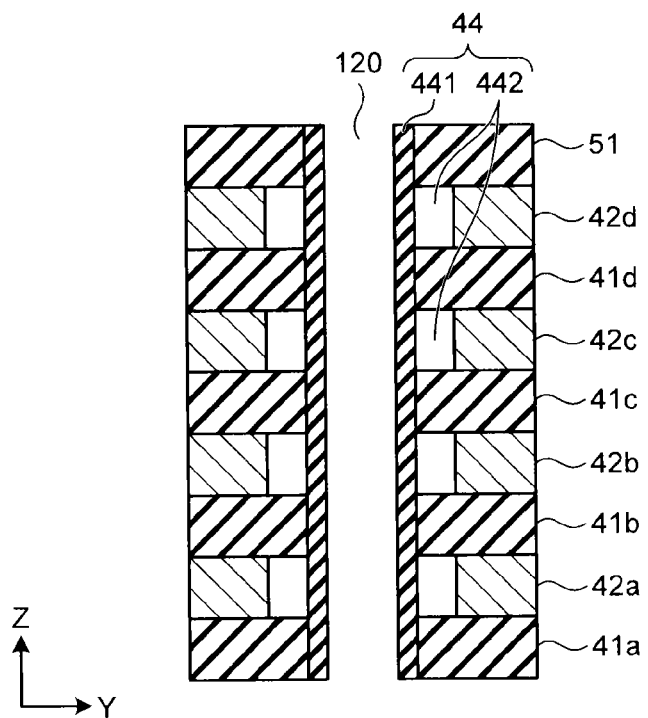

Next, as illustrated in FIG. 7E, the first variable resistive layer 441 is formed on the side surface and the bottom surface of the trench 120 and the top surface of the interlayer insulating film 51. The first variable resistive layer 441 is formed by a film forming method in which a film can be coated in a conformal manner on the side surface and the bottom surface of the trench 120 and the top surface of the interlayer insulating film 51. For example, the first variable resistive layer 441 having a film thickness of 1 nm is formed by a film forming method such as an ALD (Atomic Layer Deposition) method. In addition, the first variable resistive layer can be made of $SiO_x$, $HfO_x$ or the like. Further, it is no matter that the first variable resistive layer has the stack structure of $SiO_x$ and $HfO_x$. Then, the first variable resistive layers 441 on the bottom portion of the trench 120 and the top surface of the interlayer insulating film 51 are removed by etching. As a result, the top surface of the select transistor layer which is present in the lower layer is exposed from the bottom portion of the trench 120.

Figure 7F:
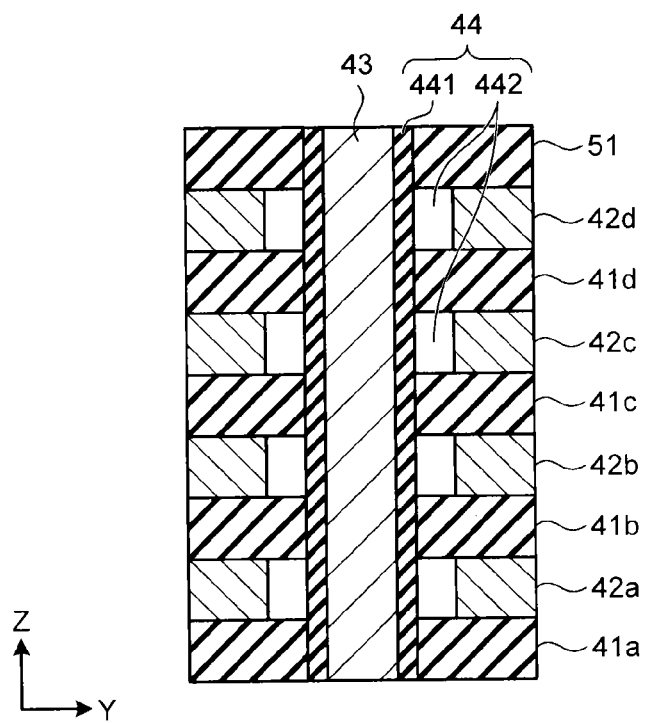

Then, as illustrated in FIG. 7F, the conductive layer 43 is formed on the entire surface of the patterned word line stack WLS so as to embed the inside of the trench 120. Next, the conductive layer 43 becomes left only inside the trench 120 by removing and polishing the conductive layer 43 protruding to the upside of the interlayer insulating film 51 by a CMP (Chemical Mechanical Polishing) method. As the conductive layer 43, for example, an n+ polycrystalline silicon can be formed by a low-voltage CVD method.

Next, the conductive layer 43 embedded in the trench 120 is formed in a substantially cylindrical pattern using a photolithography technique and an etching technique. Specifically, the conductive layer 43 in the trench 120 is etched to form a trench (not illustrated) such that the conductive layers 43 are arranged at a predetermined interval in the X direction in the trench 120, thereby forming the local bit line LBL. In addition, the local bit line LBL is processed to be disposed at a position where the semiconductor layer 35 of the select transistor layer 30 present in the lower layer is formed. Further, the interlayer insulating film is formed to embed the trench between the adjacent local bit lines LBL (the conductive layers 43). As described above, the memory layer 40 of the nonvolatile memory device according to the first embodiment is completed.

In the first embodiment, there is provided the nonvolatile memory device having a three-dimensional structure in which nR-1Tr type strings are vertically disposed on the substrate in a matrix; that is, the bit line is vertically disposed on the substrate and has the select transistor in the end portion on a side near the substrate, and the plurality of word lines are disposed on the side surface of the bit line in the height direction through the variable resistive element forming layer 44. The variable resistive element forming layer 44 is configured to include the first variable resistive layer 441 which is disposed between the bit line and the stack of the word lines and the interlayer insulating films, and the second variable resistive layers 442 which are made by oxidizing parts of the word lines. Therefore, the configuration has effect in simply forming a large-capacity nonvolatile memory device having the bilayer structure in a narrow space so that a stable operation can be achieved by the nonvolatile memory device having the three-dimensional structure which can be arranged with a high density.

Second Embodiment

Figure 8:
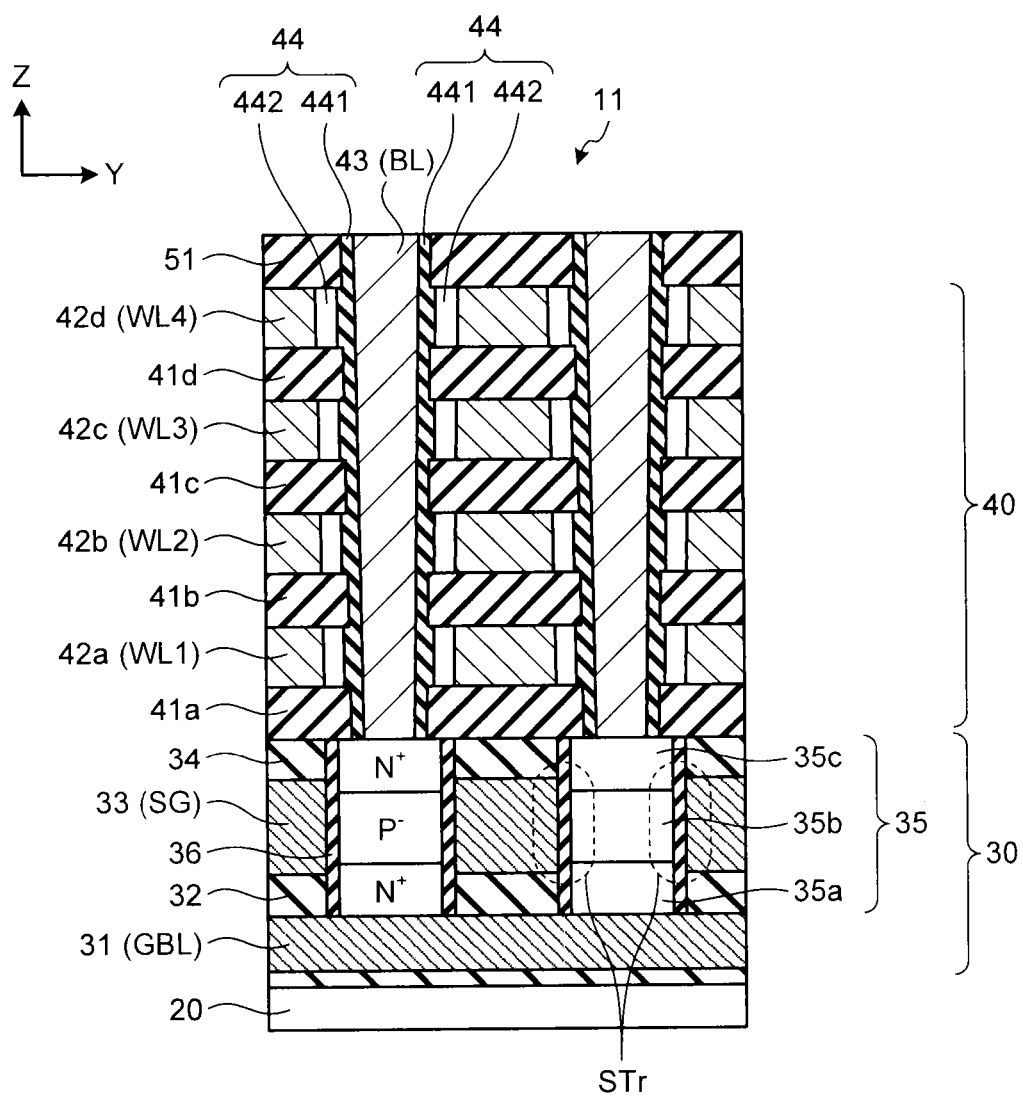
FIG. 8 is a diagram illustrating an example of a structure of a memory cell array according to a second embodiment.

FIG. 8 is a diagram illustrating an example of a structure of a memory cell array according to a second embodiment, which is an example of a cross section taken along line A-A of FIG. 3. The memory cell array 11 has the same configuration as that of the first embodiment described using FIGS. 3 and 4. In the second embodiment, the side surfaces of the second variable resistive layers 442 in the Y direction are formed further back toward the conductive layers 42a to 42d from the side surfaces of the interlayer insulating films 41a to 41d and 51 in the Y direction, and the first variable resistive layer 441 is formed further into the conductive layers 42a to 42d by that portions. As a result, the film thickness of the first variable resistive layer 441 is thin in the portions abutting on the side surfaces of the interlayer insulating films 41a to 41d and 51 in the Y direction, and thick in the portions abutting on the side surfaces of the conductive layers 42a to 42d in the Y direction.

In the second embodiment, the conductive layers 42a to 42d (the word lines WL), the second variable resistive layers 442, and parts of the first variable resistive layers 441 are interposed between the interlayer insulating films 41a to 41d and 51 which are adjacently disposed in the Z direction. Therefore, the low-resistance second variable resistive layers 442 which are adjacently disposed in the Z direction are separated from each other, and thus the structure becomes tolerant of the inter-cell interference.

Figure 9A:
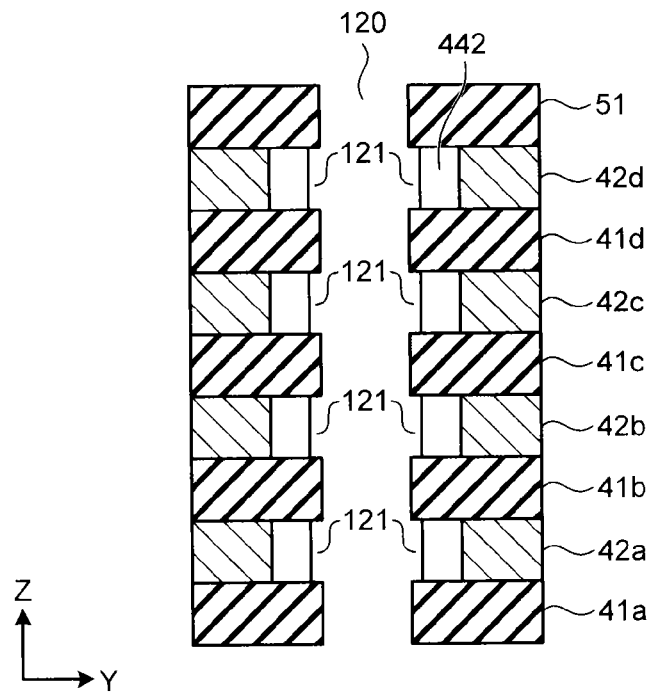
FIGS. 9A to 9C are cross-sectional views schematically illustrating an example of procedures of manufacturing a nonvolatile memory device according to the second embodiment.
Figure 9B:
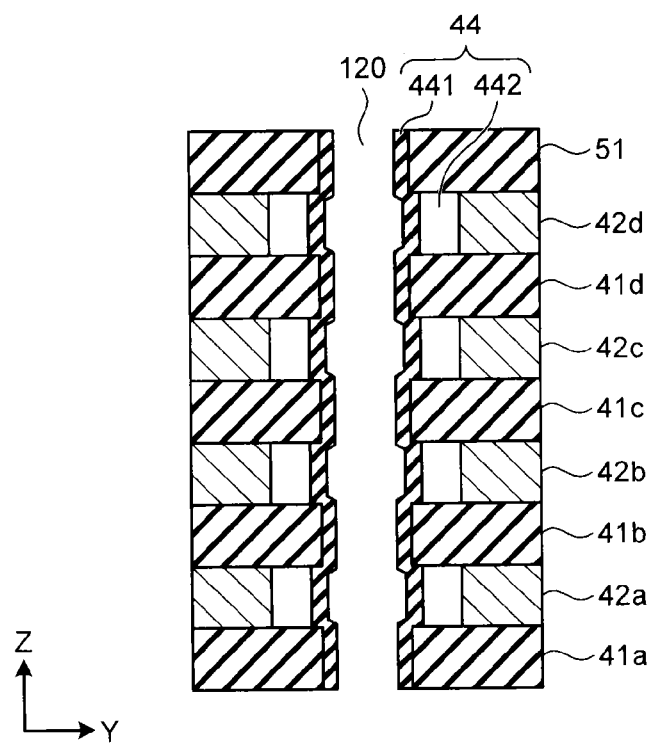
Figure 9C:
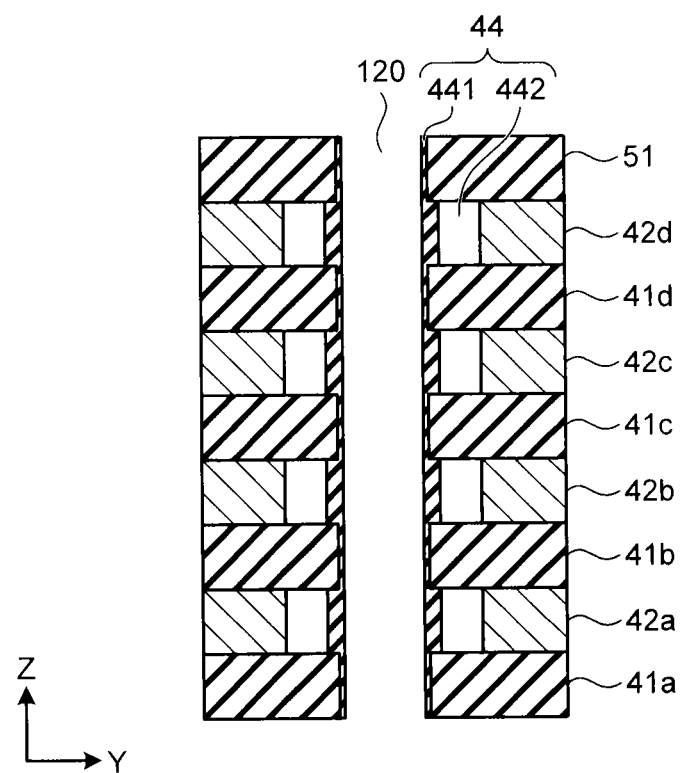

FIGS. 9A to 9C are cross-sectional views schematically illustrating an example of procedures of manufacturing a nonvolatile memory device according to the second embodiment. Similarly to FIGS. 7A to 7F, only the process of manufacturing the memory layer 40 is illustrated.

First, by the same processes as those of FIGS. 7A to 7C according to the first embodiment, the interlayer insulating films 41a to 41d and 51 and the conductive layers 42a to 42d are alternately stacked. The word line stacks WLS adjacent at a predetermined pitch in the Y direction are formed with the trench 120 which is extended in the X direction therebetween. Parts of the word lines WL are oxidized by an oxidization process.

Next, as illustrated in FIG. 9A, parts of the second variable resistive layer 442 protruding from the side surfaces of the interlayer insulating films 41a to 41d and 51 in the Y direction are selectively removed from the side surface of the trench 120 by the etching technique. At this time, the side surfaces of the second variable resistive layers 442 in the Y direction are selectively removed to be positioned back into the conductive layers 42a to 42d from the side surfaces of the interlayer insulating films 41a to 41d and 51 in the Y direction. As a result, the side surfaces of the second variable resistive layers 442 in the Y direction are formed back from the side surfaces of the interlayer insulating films 41a to 41d in the Y direction, thereby forming concave portions 121.

Then, as illustrated in FIG. 9B, the first variable resistive layer 441 is formed on the side surface and the bottom surface of the trench 120 and the top surface of the interlayer insulating film 51. The manufacturing can be made by an ALD method or the like in which the side surface and the bottom surface of the trench 120 and the top surface of the interlayer insulating film 51 can be coated in a conformal manner. The first variable resistive layer 441 may have a concavo-convex top surface along with its concavo-convex foundation. In addition, the first variable resistive layer 441 can be made using $SiO_2$, $HfO_2$, or the like.

Then, as illustrated in FIG. 9C, the first variable resistive layers 441 on the bottom portion of the trench 120 and the top surface of the interlayer insulating film 51 are etched back and removed by an anisotropic etching. As a result, the top surface of the select transistor layer present in the lower layer is exposed from the bottom portion of the trench 120. Further, portions of the first variable resistive layer 441 protruding in the Y direction are removed, and surfaces (perpendicular surfaces in the Y direction) of the first variable resistive layer 441 exposed from the side surface of the trench 120 become flush with each other.

Then, similarly to the subsequent procedures of FIG. 7F, the conductive layer 43 is formed to embed the trench 120, thereby finishing the nonvolatile memory device illustrated in FIG. 8.

Figure 10:
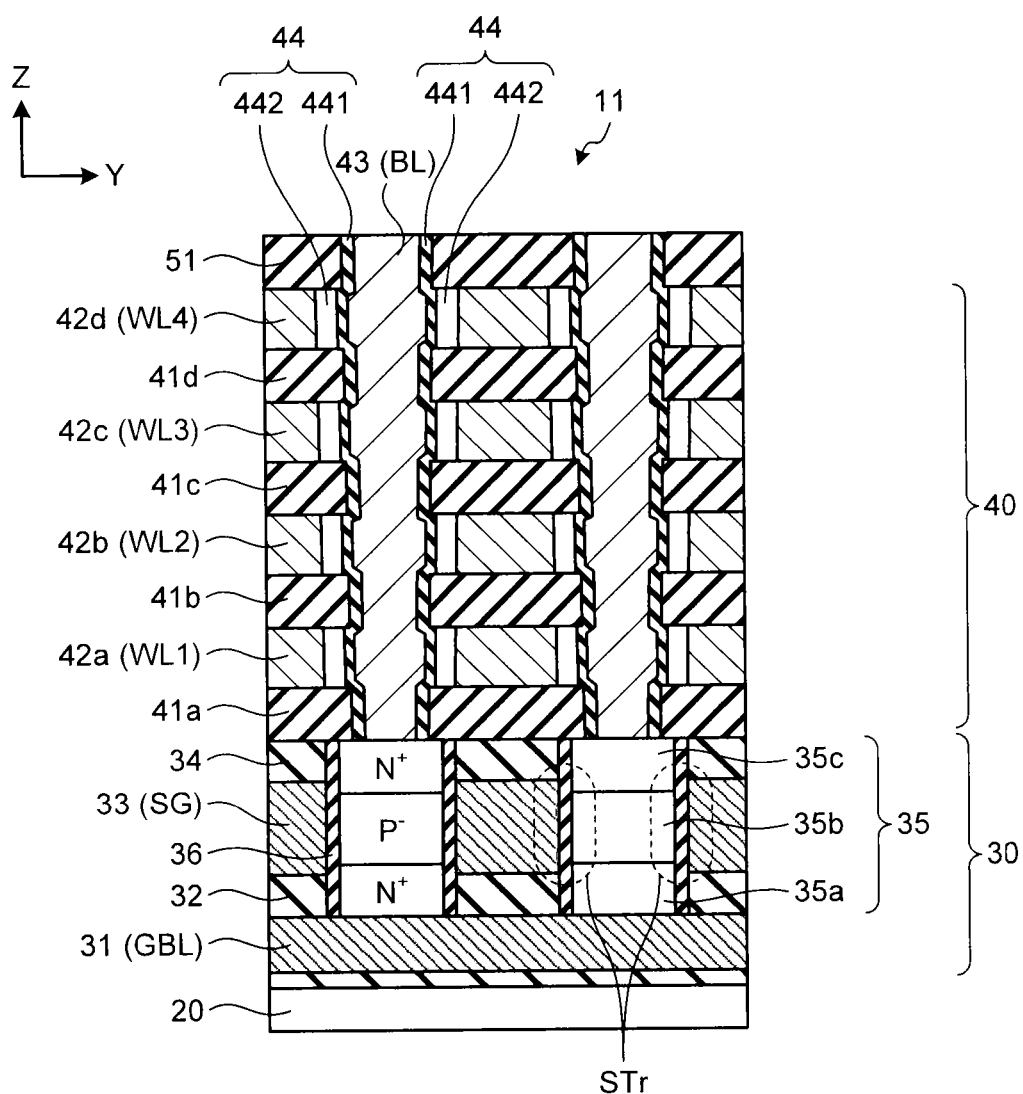
FIG. 10 is a cross-sectional view schematically illustrating another example of the structure of the nonvolatile memory device according to the second embodiment.

FIG. 10 is a cross-sectional view schematically illustrating another example of the structure of the nonvolatile memory device according to the second embodiment. In the anisotropic etching of FIG. 9C, the surfaces (the perpendicular surfaces in the Y direction) of the first variable resistive layers 441 abutting on the conductive layer 43 are illustrated as flat surfaces, but the surfaces may be changed with the concavo-convex shape. As illustrated in FIG. 10, the first variable resistive layer 441 is formed to cover the interlayer insulating films 41a to 41d and 51 and the side surfaces of the second variable resistive layers 442 in the Y direction with substantially the same film thickness. Therefore, the perpendicular surfaces of the first variable resistive layers 441 in the Y direction are formed in the concavo-convex shape along with its foundation, the interlayer insulating films 41a to 41d and 51 and the side surfaces of the second variable resistive layers 442 in the Y direction.

In the second embodiment, the side surfaces of the second variable resistive layers 442 in the Y direction are formed back from the side surfaces of the interlayer insulating films 41a to 41d and 51 in the Y direction. As a result, between the low-resistance second variable resistive layers 442 adjacent in the Z direction, it is possible to increase the length of a leak path passing through the boundaries of the interlayer insulating films 41 and 51. Therefore, the structure becomes effectively tolerant of the inter-cell interference.

Third Embodiment

Figure 11:
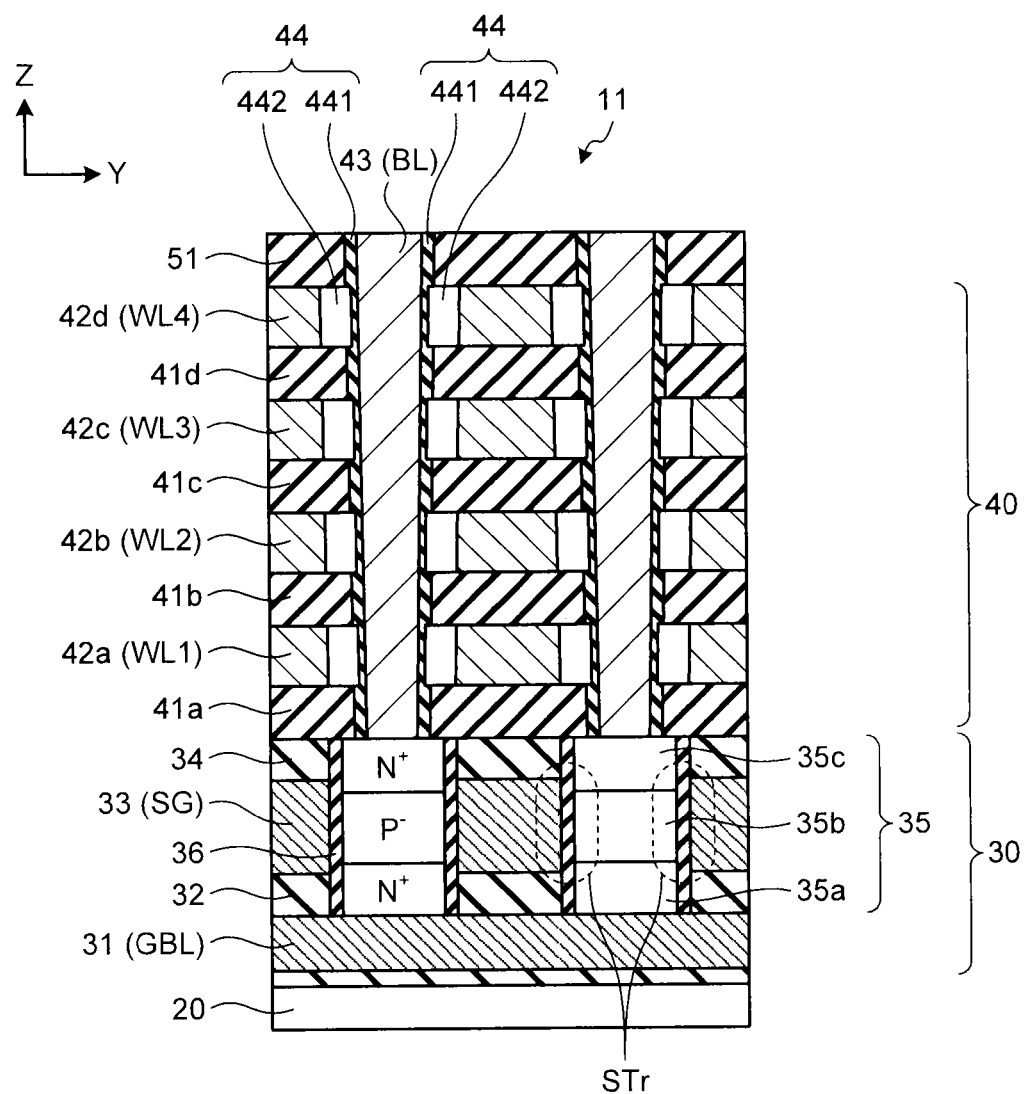
FIG. 11 is a diagram illustrating an example of a structure of a memory cell array according to a third embodiment.

FIG. 11 is a diagram illustrating an example of a structure of a memory cell array according to a third embodiment, which is an example of a cross section taken along line A-A of FIG. 3. The memory cell array 11 has the same configuration as that of the first embodiment described using FIGS. 3 and 4. In the third embodiment, the side surfaces of the second variable resistive layers 442 in the Y direction are formed to protrude toward the conductive layer 43 from the side surfaces of the interlayer insulating films 41a to 41d and 51 in the Y direction. In other words, the side surfaces of the interlayer insulating films 41a to 41d and 51 in the Y direction are formed back on a side opposite to the conductive layer 43 from the side surfaces of the second variable resistive layer 442 in the Y direction. As a result, the film thickness of the first variable resistive layer 441 abutting on the side surfaces of the second variable resistive layer 442 in the Y direction is made thinner than that of the first variable resistive layer 441 abutting on the side surfaces of the interlayer insulating films 41a to 41d and 51 in the Y direction.

In the third embodiment, the conductive layers 42a to 42d (the word lines WL) and the second variable resistive layer 442 are formed between the interlayer insulating films 41a to 41d and 51 which are disposed adjacent in the Z direction, and parts of the second variable resistive layers 442 protrude toward the conductive layer 43 from the side surfaces of the interlayer insulating films 41a to 41d and 51 in the Y direction. Further, the film thickness of the first variable resistive layer 441 becomes thin at positions where the word lines WL are formed in the Z direction. As a result, during the forming process, an electric field is focused onto the portions having the thin film thickness of the first variable resistive layer 441, and thus the filaments are effectively formed with ease.

Figure 12A:
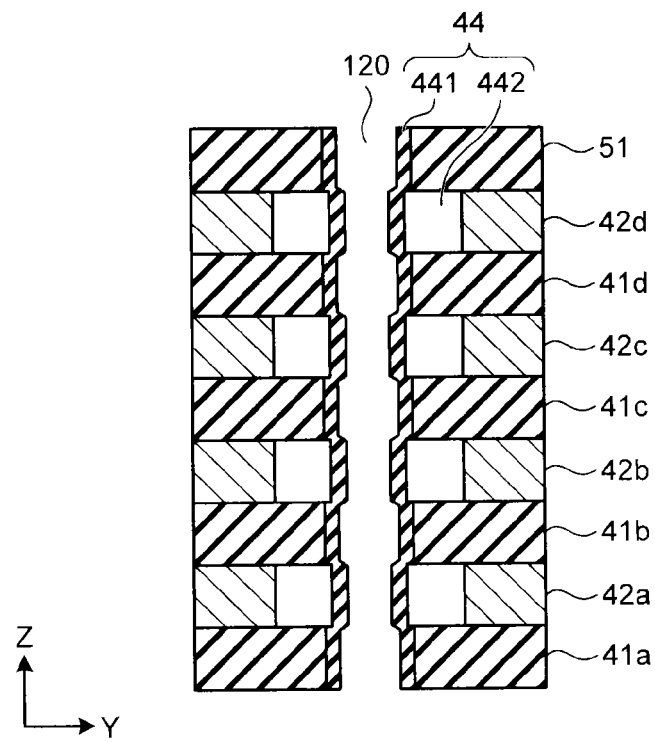
FIGS. 12A and 12B are cross-sectional views schematically illustrating an example of procedures of manufacturing a nonvolatile memory device according to the third embodiment.
Figure 12B:
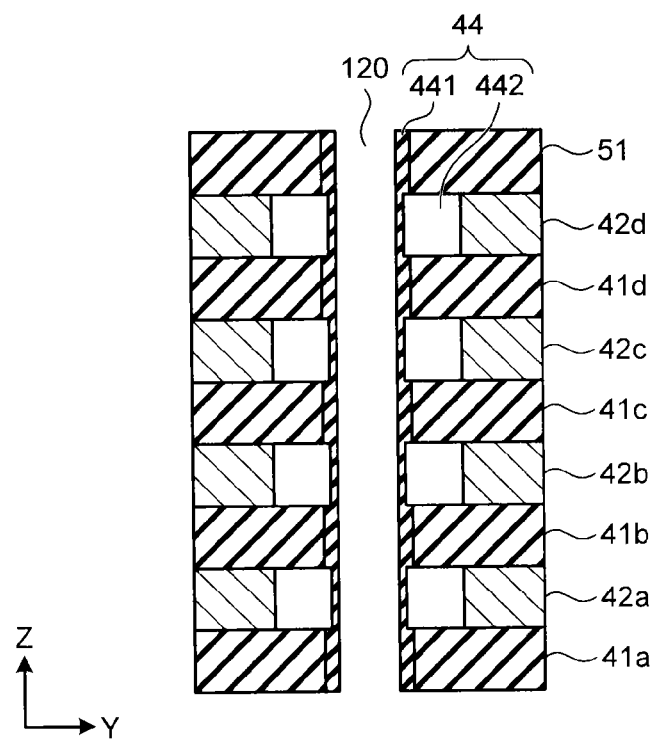

FIGS. 12A and 12B are cross-sectional views schematically illustrating an example of procedures of manufacturing a nonvolatile memory device according to the third embodiment. Similarly to FIGS. 7A to 7F, only the process of manufacturing the memory layer 40 is illustrated.

First, by the same processes as those of FIGS. 7A to 7C according to the first embodiment, the interlayer insulating films 41a to 41d and 51 and the conductive layers 42a to 42d are alternately stacked. The word line stacks WLS adjacent at a predetermined pitch in the Y direction are formed with the trench 120 which is extended in the X direction therebetween. Parts of the word lines WL are oxidized by an oxidization process.

Next, as illustrated in FIG. 12A, the first variable resistive layer 441 is formed on the side surface and the bottom surface of the trench 120 and the top surface of the interlayer insulating film 51. The side surface and the bottom surface of the trench 120 and the top surface of the interlayer insulating film 51 are coated in a conformal manner. The first variable resistive layer 441, for example, can be formed by the ALD method or the like. In the third embodiment, in the side surface of the trench 120, in a state where the side surfaces of the second variable resistive layers 442 in the Y direction protrude toward the trench 120 from the side surfaces of the interlayer insulating films 41a to 41d and 51 in the Y direction, the first variable resistive layer 441 is formed in the trench 120. The first variable resistive layer 441 has a concavo-convex surface exposed to the trench 120 along with the concavo-convex shape of its foundation. In addition, the first variable resistive layer 441 can be made using $SiO_2$, $HfO_2$, or the like.

Then, as illustrated in FIG. 12B, the first variable resistive layers 441 on the bottom portion of the trench 120 and the top surface of the interlayer insulating film 51 are etched back and removed by an anisotropic etching. As a result, the top surface of the select transistor layer which is present in the lower layer is exposed from the bottom portion of the trench 120. Further, parts of the convex portions of the first variable resistive layer 441 are removed, and the perpendicular surfaces in the Y direction become substantially flush with each other.

Then, similarly to the subsequent procedures of FIG. 7F, the conductive layer 43 is formed to embed the trench 120, thereby finishing the nonvolatile memory device illustrated in FIG. 11.

Figure 13:
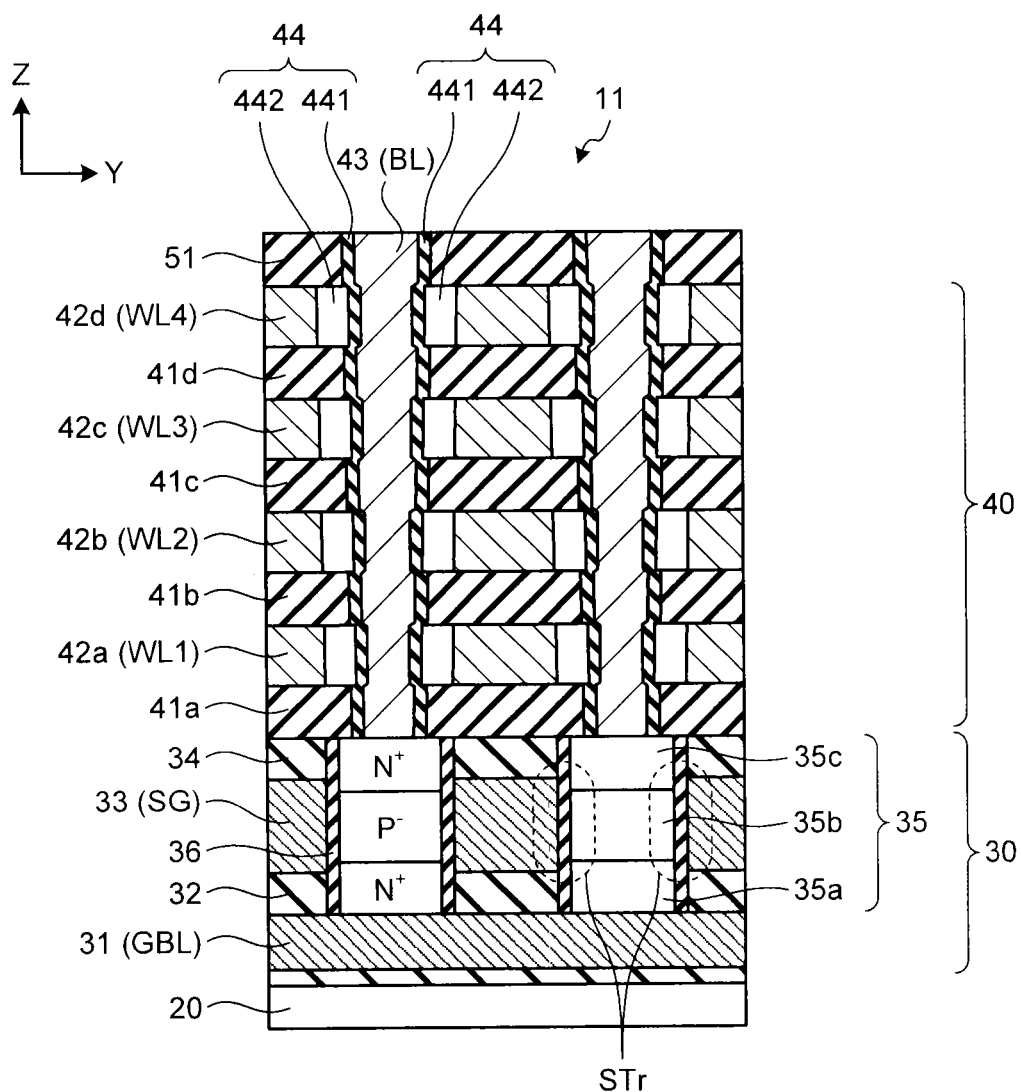
FIG. 13 is a cross-sectional view schematically illustrating another example of the structure of the nonvolatile memory device according to the third embodiment.

FIG. 13 is a cross-sectional view schematically illustrating another example of the structure of the nonvolatile memory device according to the third embodiment. In the anisotropic etching of FIG. 12B, the perpendicular surfaces of the first variable resistive layers 441 in the Y direction are illustrated as flat surfaces, but the surfaces may be changed with the concavo-convex shape. As illustrated in FIG. 13, the first variable resistive layer 441 is formed to cover the interlayer insulating films 41a to 41d and 51 and the side surfaces of the second variable resistive layers 442 in the Y direction with substantially the same film thickness. Therefore, the perpendicular surfaces of the first variable resistive layers 441 in the Y direction are formed in the concave-convex shape along with its foundation, the interlayer insulating films 41a to 41d and 51 and the side surfaces of the second variable resistive layers 442 in the Y direction.

In the third embodiment, the side surfaces of the second variable resistive layers 442 in the Y direction protrude toward the conductive layer 43 from the side surfaces of the interlayer insulating films 41a to 41d and 51 in the Y direction. Further, the film thickness of the first variable resistive layer 441 becomes thin at positions where the word lines WL are formed. As a result, during the forming process, an electric field is focused onto the portions having the thin film thickness of the first variable resistive layer 441, and thus the filaments are effectively formed with ease.

Fourth Embodiment

Figure 14:
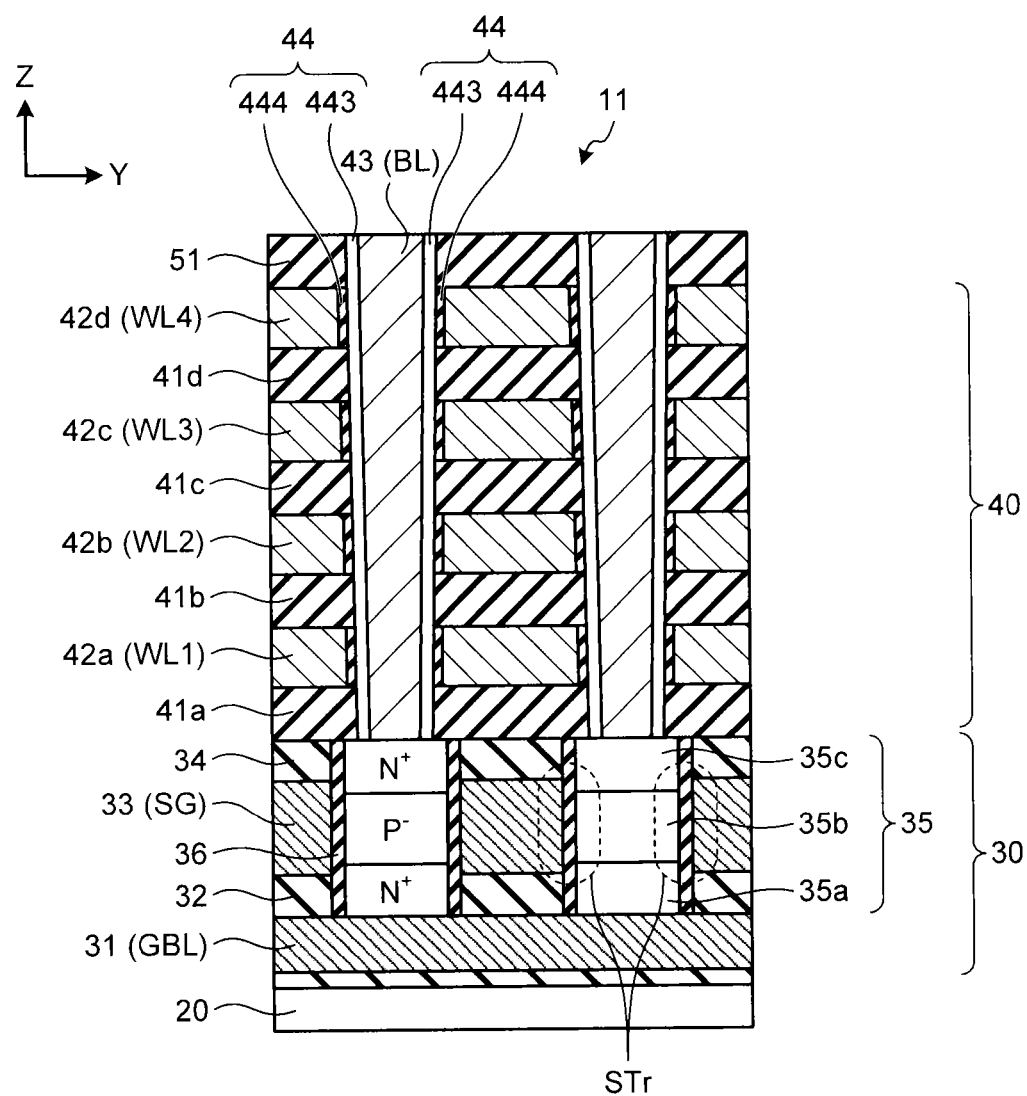
FIG. 14 is a diagram illustrating an example of a structure of a memory cell array according to a fourth embodiment.

FIG. 14 is a diagram illustrating an example of a structure of a memory cell array according to a fourth embodiment, which is an example of a cross section taken along line A-A of FIG. 3. The memory cell array 11 has the same configuration as that of the first embodiment described using FIGS. 3 and 4. In the fourth embodiment, the variable resistive element forming layer 44 includes a low-resistance first variable resistive layer 443 having a small resistivity and a high resistance of second variable resistive layer 444 having a large resistivity. The first variable resistive layers 443 are provided on the side surfaces of the plurality of cylindrical conductive layers 43 arranged in the X direction, and are shared with, for example, the side surfaces of the cylindrical conductive layers 43 in the Y direction. The second variable resistive layer 444 is disposed between each of the conductive layers 42a to 42d and the first variable resistive layer 443. Further, the second variable resistive layer 444 is disposed to be interposed between each pair of the interlayer insulating films 41a to 41d adjacent in the Z direction. In other words, the area of the second variable resistive layer 444 in the ZX plane is substantially equal to that of the conductive layers 42a to 42d (the word lines WL) in the ZX plane.

The first variable resistive layer 443 is made of metal oxide which has a low resistivity compared to that of the second variable resistive layer 444. As the first variable resistive layer 443, metal oxide containing at least one of Al, Ti, Hf, Zr, Nb, Ta, and the like is used. These metal oxides have a less composition of oxygen compared to the stoichiometric ratios of the metal oxide materials. Further, having a less resistivity compared to that of the second variable resistive layer 444, the first variable resistive layer 443 has a large oxygen deficiency compared to that of the second variable resistive layer 444.

The second variable resistive layer 444 is configured by an insulating film. As the second variable resistive layer 444, $Al_2O_3$, $Ta_2O_5$, NiO, and the like can be used. Having a large resistivity compared to that of the first variable resistive layer 443, the second variable resistive layer 444 has a small oxygen deficiency compared to that of the first variable resistive layer 443. In addition, the film thickness of the second variable resistive layer 444 may be sufficient as thin as that of the first variable resistive layer 443, but it is desirable to be equal to or less than 2 nm.

Further, in the fourth embodiment, the materials forming the conductive layers 42a to 42d are made of a metal such as Al, Ta, and Ni unlike the first embodiment. In other words, the second variable resistive layer 444 is made of metal oxide obtained by oxidizing parts of the conductive layers 42a to 42d. In a case where the conductive layers 42a to 42d are made of Al, the second variable resistive layer 444 is made of $Al_2O_3$; in a case where the conductive layers 42a to 42d are made of Ta, the second variable resistive layer 444 is made of $Ta_2O_5$; and in a case where the conductive layers 42a to 42d are made of Ni, the second variable resistive layer 444 is made of NiO. Further, since the second variable resistive layer 444 is made of an insulating body unlike the first embodiment, the composition of oxygen in the metal oxide becomes the stoichiometric composition.

Further, the band gap of the second variable resistive layer 444 is desirable to be larger than that of the first variable resistive layer 443. This is because when a voltage negative with respect to the bit line (the conductive layer 43) is applied, the voltage is caused to be applied to the second variable resistive layer 444, thereby easily forming a filament in the word line WL (the conductive layers 42a to 42d).

Even in the fourth embodiment, a material which operates in the bipolar mode is used. While the filament is formed in the variable resistive element forming layer 44 by the forming process, the switch region on which the variable resistive operation is performed is formed in the second variable resistive layer 444 (on a side near the word line WL). Therefore, the variable resistive element forming layer 44 in the high resistance state transitions to the low resistance state when a negative set voltage lower than the first threshold voltage is applied to the word line WL with respect to the bit line BL. In this state, when the word line WL is applied with a reset voltage which is positive with respect to the bit line BL and higher than the second threshold voltage, the variable resistive element forming layer 44 transitions to the high resistance state. In this way, the second variable resistive layer 444 which is an insulating body is provided on a side near the word line WL to which a positive voltage is applied during the reset operation. In addition, the same components as those of the first embodiment are denoted by the same reference numerals and the descriptions thereof will not be repeated.

Further, a method of manufacturing the nonvolatile memory device according to the fourth embodiment can also be performed along the same procedures described in the first embodiment. However, there is a difference in that the film thickness of the first variable resistive layer 443 formed in FIG. 7E is thicker than that of the second variable resistive layer 444 formed in FIG. 7D, and an oxidization process is performed such that the oxygen deficiency does not occur in the second variable resistive layer 444 formed in FIGS. 7C and 7D. Further, the structures exemplified in the second to third embodiments can be applied even to the fourth embodiment.

The same advantage as that of the first embodiment can be obtained even in the fourth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

(Note)

[Note 1]

A method of manufacturing a nonvolatile memory device, including:

forming a stack in which an interlayer insulating film and a first conductive layer are alternately stacked;

separating the stack by a first trench extended in a first direction to form a first conductive layer stack;

forming a first variable resistive layer by oxidizing the first conductive layer in the first trench until to be a predetermined film thickness;

forming a second variable resistive layer to cover a side surface of the first conductive layer stack intersecting with a second direction which is intersected with the first direction;

embedding the first trench covered with the second variable resistive layer, with a second conductive layer;

separating the second conductive layer by a second trench to cause the second conductive layers to be disposed in the first trench at a predetermined interval in the first direction; and embedding the second trench with an insulating film.

[Note 2]

The method of manufacturing the nonvolatile memory device according to note 1, wherein the first conductive layer is made of a material selected from a group consisting of tungsten, nickel, titanium, tantalum, tungsten nitride, titanium nitride, and tantalum nitride, and in the forming of the first variable resistive layer, the first variable resistive layer is made of a material selected from a group consisting of tungsten oxide, nickel oxide, titanium oxide, tantalum oxide, tungsten oxynitride, titanium oxynitride, tantalum oxynitride, all of which are oxygen-deficient.

[Note 3]

The method of manufacturing the nonvolatile memory device according to note 1, wherein the first conductive layer is made of Al, Ta, or Ni, and in the forming of the first variable resistive layer, the first variable resistive layer is made of $Al_2O_3$, $Ta_2O_5$, or NiO.

[Note 4]

The method of manufacturing the nonvolatile memory device according to note 1, wherein in the forming of the first variable resistive layer, the first variable resistive layer of the first conductive layer stack which protrudes in the second direction due to expansion caused by the oxidization is etched to become flush with the side surface of the interlayer insulating film in the second direction.

[Note 5]

The method of manufacturing the nonvolatile memory device according to note 1, wherein in the forming of the first variable resistive layer, the first variable resistive layer of the first conductive layer stack which protrudes in the second direction due to expansion caused by the oxidization is etched to be back from the side surface of the interlayer insulating film in the second direction.

What is claimed is:

1. A nonvolatile memory device comprising:

a plurality of first wirings configured to be arranged in a first direction and a second direction intersecting with each other, and extended in a third direction perpendicular to the first direction and the second direction;

second wiring stacks configured to include second wirings and interlayer insulating films which are extended and alternately stacked in the third direction; and memory cells configured to be disposed at positions between the first wirings and the second wirings where the first wirings and the second wirings intersect, wherein the memory cell includes, in the first direction, a first variable resistive layer which is disposed on a side near the first wiring and a second variable resistive layer which is disposed on a side near the second wiring, the second variable resistive layer is disposed between the interlayer insulating films in the third direction, and the second variable resistive layer is made of an oxide of a material constituting the second wiring, and an oxygen deficiency of the first variable resistive layer is smaller than that of the second variable resistive layer.

2. The nonvolatile memory device according to claim 1, wherein a boundary between the second wiring and the second variable resistive layer is positioned further away, in the first direction, from the first wiring than a side surface of the interlayer insulating film facing the first direction.

3. The nonvolatile memory device according to claim 2, wherein a boundary between the first variable resistive layer and the second variable resistive layer is positioned further away, in the first direction, from the first wiring than the side surface of the interlayer insulating film facing the first direction.

4. The nonvolatile memory device according to claim 2, wherein a boundary between the first variable resistive layer and the second variable resistive layer is positioned closer, in the first direction, to the first wiring than the side surface of the interlayer insulating film facing the first direction.

5. The nonvolatile memory device according to claim 1, wherein a film thickness of the first variable resistive layer is thinner than that of the second variable resistive layer.

6. The nonvolatile memory device according to claim 5, wherein the second variable resistive layer is made of a material selected from a group consisting of tungsten oxide, nickel oxide, titanium oxide, tantalum oxide, tungsten oxynitride, titanium oxynitride, tantalum oxynitride, all of which are oxygen-deficient.

7. The nonvolatile memory device according to claim 1, wherein a resistivity of the first variable resistive layer is larger than that of the second variable resistive layer.

8. The nonvolatile memory device according to claim 1, wherein a band gap of the first variable resistive layer is larger than that of the second variable resistive layer.

9. The nonvolatile memory device according to claim 1, further comprising a controller, wherein the controller allows a positive reset voltage with respect to the second wiring to be applied to the first wiring during a reset operation switching a resistance state from a low-resistance state to a high-resistance state.

10. The nonvolatile memory device according to claim 1, wherein the second wiring is made of a material selected from a group consisting of tungsten, nickel, titanium, tantalum, tungsten nitride, titanium nitride, and tantalum nitride.

11. The nonvolatile memory device according to claim 1, wherein the first variable resistive layer is any one of a silicon oxide film, an aluminum oxide film, a $HfO_2$ film, a silicon nitride film or an aluminum nitride film, or a stack of a $SiO_x$ film and a $HfO_x$ film.

12. The nonvolatile memory device according to claim 1, wherein
the first variable resistive layer is disposed along a side surface of the first wiring, and
the first variable resistive layer is disposed even between the interlayer insulating film and the first wiring.

13. The nonvolatile memory device according to claim 1, wherein
the second variable resistive layer is not disposed between the interlayer insulating film and the first wiring.

14. The nonvolatile memory device according to claim 1, further comprising:
a plurality of channel semiconductor layers that is provided at end portions of the first wirings;
a plurality of select transistors that includes a gate electrode, the gate electrode being provided on a side surface of the channel semiconductor layer with a gate insulating film therebetween, the side surface of the channel semiconductor layer facing the first direction;
a plurality of third wirings that connects the gate electrodes of the select transistors arranged in the second direction; and
a plurality of fourth wirings that is connected to other end portions of the channel semiconductor layers arranged in the first direction, the fourth wirings being provided at a predetermined interval along the second direction.

15. A nonvolatile memory device comprising:
a plurality of first wirings configured to be arranged in a first direction and a second direction intersecting with each other, and extended in a third direction perpendicular to the first direction and the second direction;
second wiring stacks configured to include second wirings and interlayer insulating films which are extended and alternately stacked in the third direction; and
memory cells configured to be disposed at positions between the first wirings and the second wirings where the first wirings and the second wirings intersect, wherein
the memory cell includes, in the first direction, a first variable resistive layer which is disposed on a side near the first wiring and a second variable resistive layer which is disposed on a side near the second wiring,
the second variable resistive layer is disposed between the interlayer insulating films in the third direction, and
the second variable resistive layer is made of an oxide of a material constituting the second wiring, and
an oxygen deficiency of the first variable resistive layer is larger than that of the second variable resistive layer.

16. The nonvolatile memory device according to claim 15, wherein
the second wiring is made of Al, Ta, or Ni.

17. The nonvolatile memory device according to claim 16, wherein
the second variable resistive layer is made of $Al_2O_3$, $Ta_2O_5$, or NiO.

18. The nonvolatile memory device according to claim 15, wherein
a film thickness of the first variable resistive layer is thicker than that of the second variable resistive layer.

19. The nonvolatile memory device according to claim 15, further comprising a controller, wherein
the controller allows a positive reset voltage with respect to the first wiring to be applied to the second wiring during a reset operation switching a resistance state from a low-resistance state to a high-resistance state.

20. The nonvolatile memory device according to claim 15, wherein
resistivity of the first variable resistive layer is smaller than that of the second variable resistive layer.

21. The nonvolatile memory device according to claim 15, wherein
a band gap of the first variable resistive layer is smaller than that of the second variable resistive layer.

* * * * *